(12) United States Patent
Priel et al.

(10) Patent No.: US 8,390,369 B2
(45) Date of Patent: Mar. 5, 2013

(54) ELECTRONIC CIRCUIT AND METHOD FOR OPERATING A MODULE IN A FUNCTIONAL MODE AND IN AN IDLE MODE

(75) Inventors: Michael Priel, Hertzelia (IL); Anton Rozen, Gedera (IL); Yaakov Seidenwar, Netanya (IL)

(73) Assignee: Freescale Semiconductor, Inc., Austin, TX (US)

( * ) Notice: Subject to any disclaimer, the term of this patent is extended or adjusted under 35 U.S.C. 154(b) by 101 days.

(21) Appl. No.: 12/850,650

(22) Filed: Aug. 5, 2010

(65) Prior Publication Data

US 2012/0032719 A1 Feb. 9, 2012

(51) Int. Cl.
G05F 1/10 (2006.01)

(52) U.S. Cl. ............................ 327/544; 326/33; 327/202

(58) Field of Classification Search .................. 327/544; 326/33
See application file for complete search history.

(56) References Cited

U.S. PATENT DOCUMENTS

| | | | |
|---|---|---|---|
| 5,982,211 A * | 11/1999 | Ko | 327/202 |
| 6,310,491 B1 * | 10/2001 | Ogawa | 326/46 |
| 6,492,854 B1 | 12/2002 | Ku et al. | |
| 7,183,825 B2 * | 2/2007 | Padhye et al. | 327/202 |
| 7,369,446 B2 * | 5/2008 | Chan et al. | 365/189.05 |
| 7,480,883 B2 | 1/2009 | Correale, Jr. et al. | |
| 7,533,226 B2 * | 5/2009 | Flautner et al. | 711/156 |
| 7,548,103 B2 * | 6/2009 | Ramaraju et al. | 327/218 |
| 7,639,056 B2 * | 12/2009 | Gururajarao et al. | 327/202 |
| 7,737,509 B2 * | 6/2010 | Ishibashi et al. | 257/392 |
| 8,018,247 B2 * | 9/2011 | Priel et al. | 326/34 |
| 8,076,965 B2 * | 12/2011 | Djaja et al. | 327/202 |
| 2004/0061135 A1 * | 4/2004 | Ikeno et al. | 257/200 |
| 2008/0054973 A1 * | 3/2008 | Chan et al. | 327/208 |
| 2009/0295770 A1 * | 12/2009 | Woo et al. | 345/208 |

* cited by examiner

Primary Examiner — Thomas J Hiltunen

(57) ABSTRACT

A method and an electronic circuit, the electronic circuit includes: a module that comprises multiple flip-flops and a control signal providing circuit; a power management circuit arranged to provide to the module a supply voltage of a functional level when the module is in a functional mode, and to provide to the module a supply voltage of an idle level when the module is in an idle mode; wherein the control signal providing circuit is arranged to provide to the multiple flip-flops, when the module is in the functional mode, a control signal that facilitates a state change of each of the multiple flip-flops; wherein the control signal providing circuit is arranged to provide to the multiple flip-flops, when the module is in the idle mode, a control signal that prevents a state change of each of the multiple flip-flops; wherein the each of the control signal providing circuit and a plurality of flip-flops of the multiple flip-flops comprises at least one hybrid circuit that comprises a low-threshold transistor that is coupled in parallel to at least one high-threshold transistor; wherein each hybrid circuit is arranged to maintain information or a control signal when provided with the supply voltage of the idle level; and wherein high-threshold transistors of each hybrid circuit are arranged to maintain information or a control signal when provided with a supply voltage of a level that is higher than the idle level.

17 Claims, 6 Drawing Sheets

ELECTRONIC CIRCUIT AND METHOD FOR OPERATING A MODULE IN A FUNCTIONAL MODE AND IN AN IDLE MODE

FIELD OF THE INVENTION

This invention relates to a method and an electronic circuit for operating a module in a functional mode and in an idle mode.

BACKGROUND OF THE INVENTION

Various strategies have been developed to help reducing power consumption of an integrated circuit while maintaining the same levels of performance and functionality. For example, the integrated circuit can be maintained in an idle mode from time to time, thus reducing the power consumption of the integrated circuit.

A high performance level requires using low-threshold transistors that are fast but suffer from high leakage. A low level of power consumption requires using high-threshold transistors that exhibit low leakage but are slow and may require a high idle voltage in order to maintain information when in an idle mode.

SUMMARY OF THE INVENTION

The present invention provides a method and an electronic circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs. are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
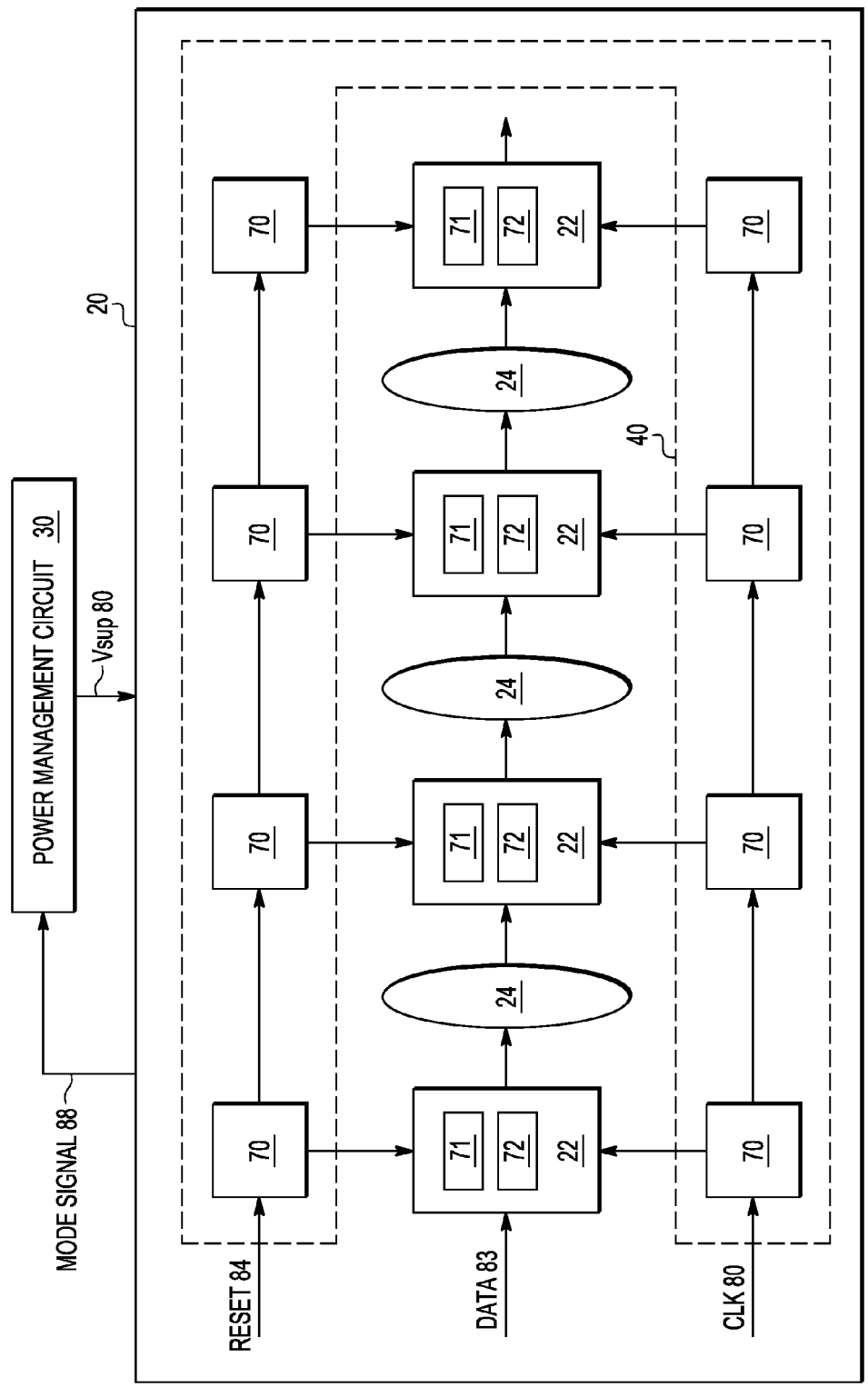
FIG. 1 schematically shows an example of an embodiment of an electronic circuit.

FIG. 1 schematically shows an example of an embodiment of an electronic circuit 10. The electronic circuit 10 can be a part of mobile phone, a media player or any other rechargeable device.

The electronic circuit 10 includes a module 20 and a power management circuit 30. The module 20 can be a processor, a control circuit, a core, a hardware accelerator or other logic circuit.

The module 20 has a functional mode and an idle mode. In the functional mode the module 20 may perform its primary function, such as processing or storing information. When in the idle mode the module 20 should store information generated before entering the idle mode.

When in the idle mode the module 20 consumes power as a result of leakage currents. The leakage current can be reduced by including high-threshold transistors in the module 20. These high-threshold transistors may require a provision of a supply voltage of a high-threshold transistor level—thus increasing the power consumption of the electronic circuit 10.

The module 20 can further include hybrid circuits 71 and 72. Hybrid circuits 71 and 72 can maintain information even when receiving a supply voltage of the idle level that is lower than the high-threshold transistor idle level. The hybrid circuits include, in this example, one or more low voltage threshold transistors (also referred to as low-threshold transistors) and one or more high voltage threshold transistors (also referred to as high-threshold transistors). Each low-threshold transistor can be connected in parallel to one or more high-threshold transistors to form a hybrid circuit, such as the shown hybrid circuits 71 and 72.

The power management circuit 30 is arranged to provide a supply voltage Vsup 80 of a functional level to the module 20, when the module 20 is in a functional mode. The power management circuit 30 can be informed about a change in an operational mode of the module 20 in various manners. For example, the module 20 can send to the power management circuit 30 a mode signal (such as mode signal 88), an interrupt request, and the like. Yet for another example, the power management circuit 30 can determine to change the mode of the module 20.

The power management circuit 30 is also arranged to provide a supply voltage Vsup 80 of an idle level to the module 20 when the module 20 is in an idle mode.

The idle level of Vsup 80 can be lower by few tens of milli-Volts than a high-threshold transistor idle level that is required to maintain information in high-threshold transistors when module 20 is in the idle mode. The idle level can, for example, be lower by 150 mV (or more) than a high-threshold transistor idle level. The provision of the Vsup 80 of a lower level (than the high-threshold transistor idle level) contributes to a reduction in power consumption when the module 20 is in the idle mode.

The information is maintained when the module 20 is in the idle mode because the low-threshold transistors of the hybrid circuits 71 and 72 can maintain the information and are connected in parallel to one or more high-threshold transistors 60. These low-threshold transistors can maintain the information by charging or discharging any load that is connected to the low-threshold transistors. The charging or discharging operations are not interrupted and especially are not reversed by the high-threshold transistors that are connected in parallel to the low-threshold transistor and may not function when provided with Vsup 80 of a functional level.

The power consumption of module 20 during idle mode is lower then the power consumption of a module that has its information saved (during an idle mode) only by high-threshold transistors and that should receive a supply voltage of a high-threshold transistor idle level to maintain the information.

Once the module 20 exits the idle mode the multiple flip-flops 22 can output (or otherwise use) the information that is generated before the module 20 exits the functional mode and is stored in the multi flip-flops while the module 20 was in the idle mode.

As shown in FIG. 1, the module 20 may further include multiple logic circuits 24 and a control signal providing circuit 40. In the example of FIG. 1, each flip-flop 22 is connected to one or more logic circuits 24. The logic circuits 24 may include one or more logic gates such as inverters, OR gates, AND gates, XOR gates, NOR gates, NAND gates, NXOR gates and the like. The multiple flip-flops 22 store information that is generated by the multiple logic circuits 24 when in the functional mode.

Figure 2:
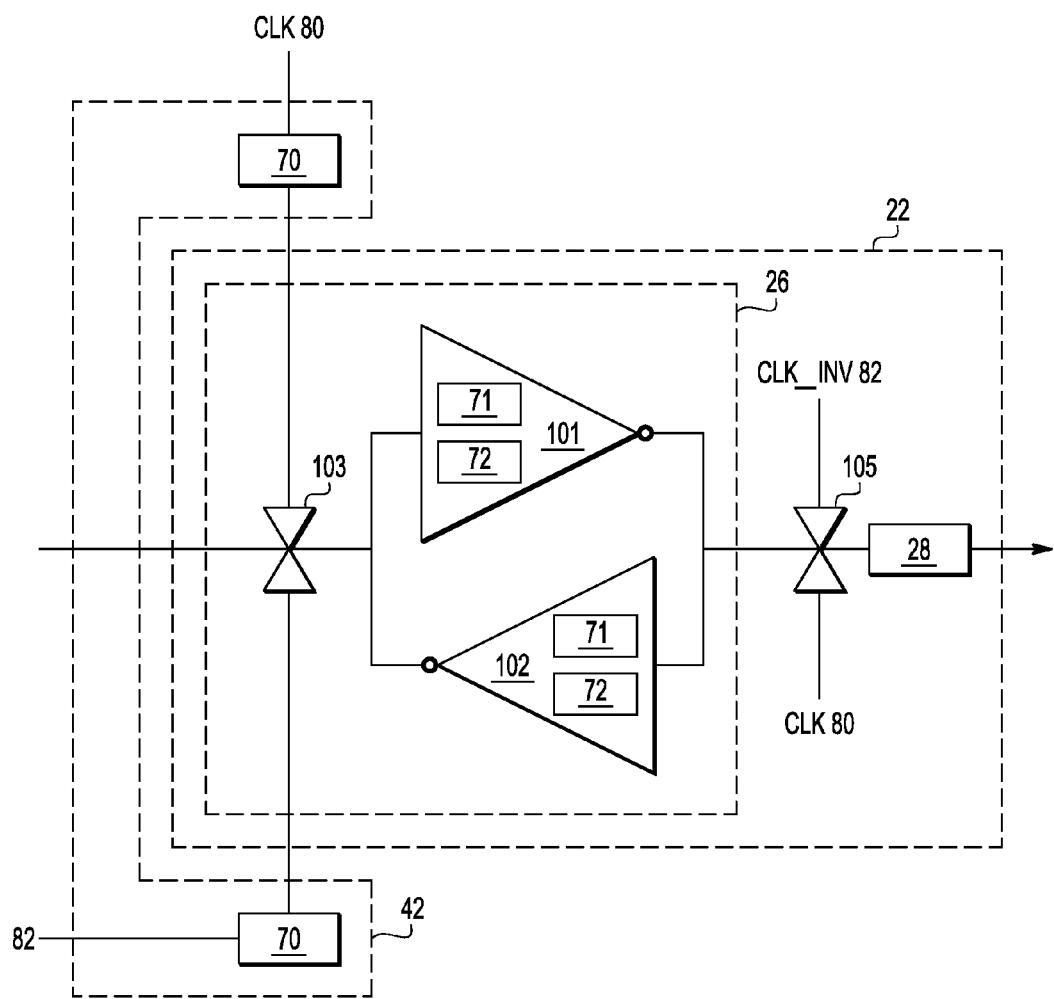
FIG. 2 schematically shows an example of an embodiment of a flip-flop and a portion of a control signal providing circuit of the electronic circuit of FIG. 1.
Figure 3:
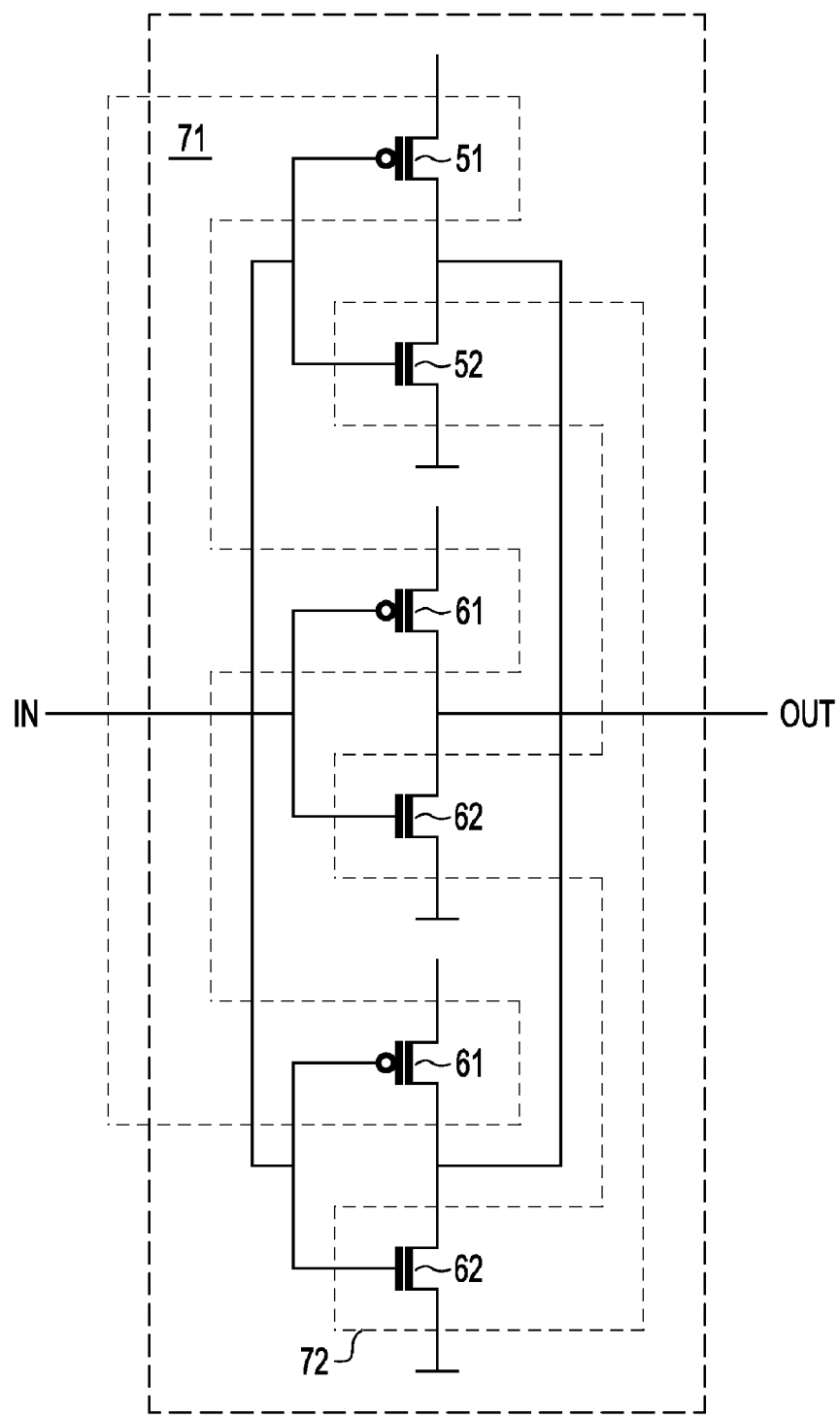
FIG. 3 schematically shows an example of an embodiment of an inverter of the flip-flop of FIG. 2.

In the shown example, each flip-flop 22 of the multiple flip-flops includes a majority of high-threshold transistors and a minority of low-threshold transistors. Having only a minority of low-threshold transistors contributes to a low leakage level of the module 20. FIG. 2 illustrates a non-limiting example of two hybrid cells 71 and 72 that are included in two inverters 101 and 102 of a flip-flop. As illustrated in FIG. 3, the hybrid cells 71 and 72 of inverter 101 includes a single low-threshold transistor (51, 52) that is connected in parallel to a pair of high-threshold transistors (61, 62). It is noted that each low-threshold transistor can be coupled to one or more than two high-threshold transistors.

Although the example set forth in FIG. 1 illustrates each flip-flop 22 as including hybrid circuits, the module 20 can include additional flip-flops (not shown) that do not include hybrid cells (for example these additional flip-flops do not include low-threshold transistors). The flip-flops 22 that include the hybrid circuits may be selected based on the importance of information stored in these flip-flops 22. For example, the flip-flops 22 may store state information of module 22 that is required for recovering from an idle mode while the information stored in the additional flip-flops is not required for this recovery. The module 20 can include up to 10%, 5%, 2% or even about 1% of low-threshold transistors.

The leakage of the low-threshold transistors can be further reduced by using relatively small (hence—weak) low-threshold transistors. For example, the area of each low-threshold transistor is less than one half, one third, one fourth, one fifth and even less than one tenth of an area of a high-threshold transistor that is coupled in parallel to the low-threshold transistors.

Errors may be introduced when the module 20 is in the idle mode if the information that is stored in the flip-flops 22 is changed. These unwanted changes can occur if the flip-flops 22 change their state or if they are reset (or set) when the module 20 is in the idle mode. Noises on control signals such as a clock signal and a reset signal can cause one or more flip-flops 22 to be opened when the module 20 is in the idle mode.

In order to reduce the probability of such unwanted changes, control signals such as a clock signal CLK 80 and a reset signal RESET 84 are fed to the module 20 by a control signal providing circuit 40 that includes at least one hybrid circuit 70 that prevents the control signals to change when the module 20 is in the idle mode. As shown in FIG. 1, the control signal providing circuit 40 includes hybrid circuits 70 that maintain the control signals steady when the module 20 is in the idle mode.

In FIG. 1 a hybrid circuit 70 is allocated per each control signal (RESET 84 and CLK 80) and per each flip-flop 22. Alternatively, a hybrid circuit 70 may distribute a control signal to multiple flip-flops 22. Alternatively, multiple hybrid circuits 70 may be connected between a single pair of flip-flops 22.

The hybrid circuits 70 may receive the control signals from one or more control signal generators (not shown) such as a clock signal generator, reset generator and the like.

The control signals are maintained in a certain value in order to prevent unwanted changes when the module 20 is in the idle mode. If, for example, a flip-flop 22 is reset if it receives an asserted RESET 84 then the control signal providing circuit 40 provides to that flip-flop 22 a negated RESET 84. If, for example, the flip-flop 22 is reset if it receives a certain change (rising edge or falling edge) in RESET 84 then the control signal providing circuit 40 prevents RESET 84 from performing that change (for example by maintaining RESET 84 stable).

The control signal providing circuit 40 can include a combination of high-threshold transistors and low-threshold transistors and may include hybrid circuits 70, each hybrid circuit 70 can include a low-threshold transistor that is connected in parallel to one or more high-threshold transistors.

The flip-flops 22 can be fed by signals (such as data 83) that are not provided via a hybrid circuit 70. These signals are not expected to change the state of the flip-flops 22 when the module 20 is in the idle mode.

The additional flip-flops can be fed by control signals that are not provided via a hybrid circuit 70. The information stored in the additional flip-flops does not affect the recovery of the module 20 from the idle mode. Accordingly—even if a control signal changes the state of an additional flip-flops when the module 20 is in the idle mode—this change is not expected to affect the operation of the module 20 during the functional mode.

FIG. 2 schematically shows a flip-flop 22 and a portion 42 of a control signal providing circuit 40 of the electronic circuit 10 of FIG. 1.

In the shown example, each flip-flop 22 may include a pair of latches such as a master latch 26 and a slave latch 28. As shown in FIG. 2, the low-threshold transistors can be included in the master latch 26 and not in the slave latch 28. Alternatively, one or more low-threshold transistors can be included in the slave latch 28 and not in the master latch 26. Alternatively, low-threshold transistors can be included in both the master latch 26 and the slave latch 28.

Figure 4:
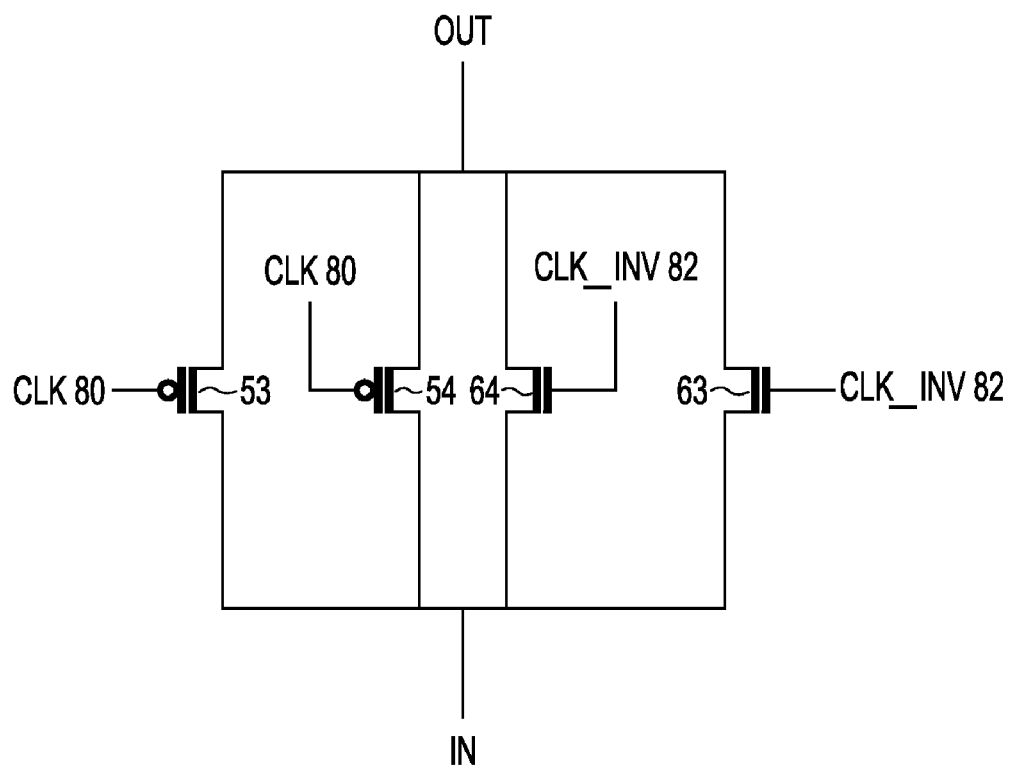
FIG. 4 schematically shows an example of an embodiment of a transfer gate of the flip-flop of FIG. 2.

The flip-flops 22 may be fed by CLK 80 as well as by an inverted clock signal CLK_INV 82. CLK_INV 82 is not illustrated in FIG. 1 but is illustrated in FIG. 2, FIG. 3, FIG. 4 and in FIG. 5.

The flip-flop 22 includes a master latch 26 and a slave latch 28. The master latch 26 includes a pair of inverters 101 and 102 and a first transfer gate 103. FIG. 3 and FIG. 4 illustrate the transistors of inverter 101 and of first transfer gate 103. Inverter 102 may have the same transistors of inverter 101.

In the shown example, each inverter of inverters 101 and 102 includes two hybrid circuits 71 and 72. The first hybrid circuit 71 includes a single low-threshold voltage PMOS transistor 51 and two high-threshold PMOS transistors 61. The second hybrid circuit 72 includes a single low-threshold voltage NMOS transistor 52 and two high-threshold NMOS transistors 62.

The single low-threshold PMOS transistor 51 is connected in a sequential manner to the single low-threshold NMOS transistor 52 to form a first pair of transistors. Each of the high-threshold NMOS transistors 62 is connected in a sequential manner to a high-threshold PMOS transistor 61 to form two additional pairs of transistors. The three pairs of transistors are connected in parallel to each other.

The first transfer gate 103 includes a single low-threshold PMOS transistor 53, a single high-threshold PMOS transistor 54, a single low-threshold NMOS transistor 63 and a single high-threshold NMOS transistor 64 that are connected to each other in parallel.

The first transfer gate 103 is fed by a pair of control signals—clock signal CLK 80 and CLK_INV 82. CLK 80 is fed to the gates of the single low-threshold PMOS transistor 53 and the single high-threshold PMOS transistor 54. CLK_INV 82 is fed to the gates of the single low-threshold NMOS transistor 63 and the single high-threshold NMOS transistor 64.

Both control signals are provided from the portion 42 of the control signal providing circuit 40. This portion 42 includes hybrid circuits 70 that prevent these control signals 80 and 82 from changing when the module 20 is in the idle mode.

A second transfer gate 105 is located between the master latch 26 and the slave latch 28. It can be identical to the first transfer gate 101 but may be fed by inverted signals CLK_INV 82 and clock signal CLK 80.

The flip-flop 22 can also be fed, through another hybrid circuit 70 of the portion 42 with RESET 84.

Figure 5:
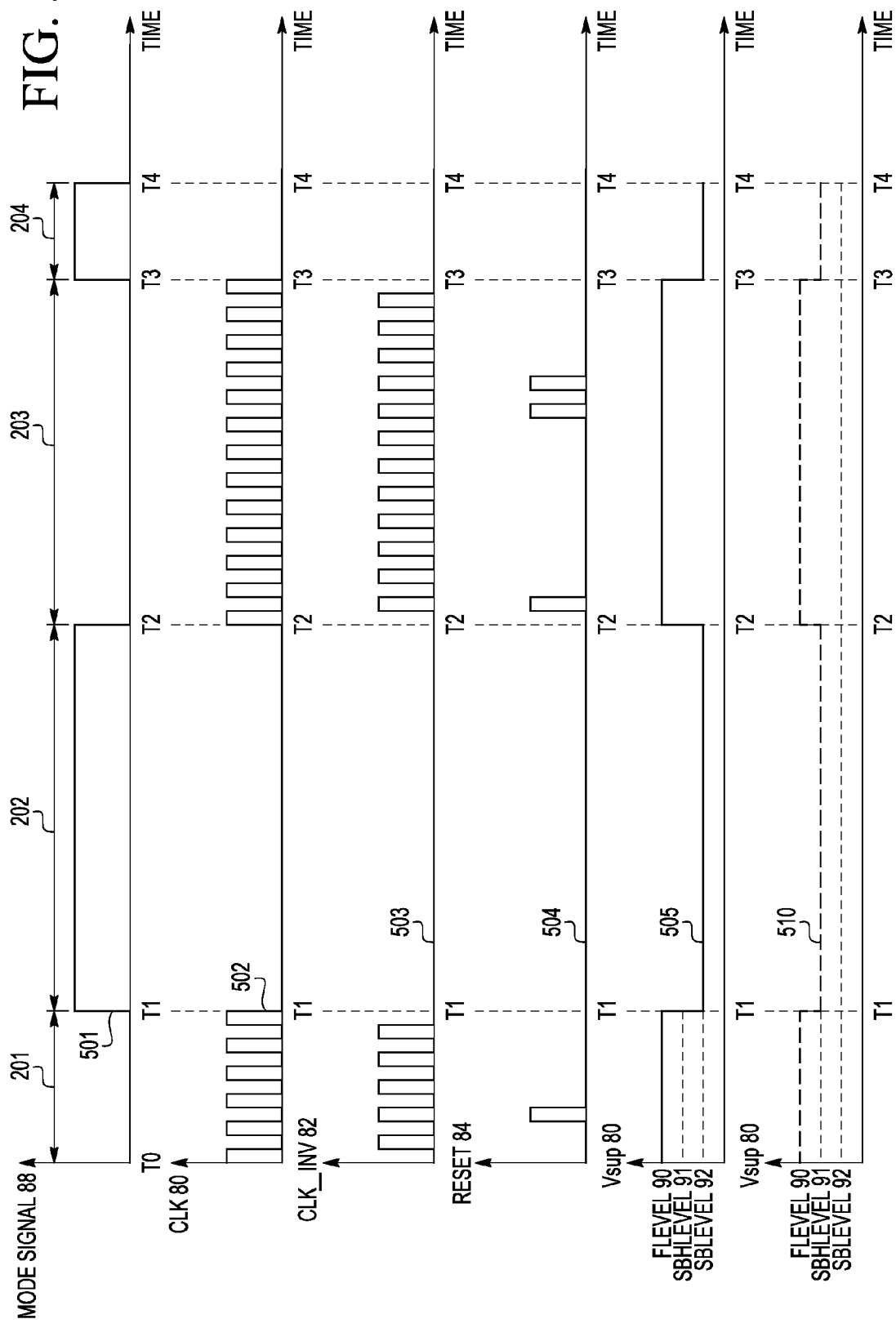
FIG. 5 schematically illustrates an example of an embodiment of control signals and supply voltages.

FIG. 5 schematically illustrates an example of an embodiment of control signals and supply voltages.

The values of the mode signal 88, the clock signals CLK 80 and CLK_INV 82, the reset signal RESET 84 and the supply voltage Vsup 80 are illustrated by curves 501-505 respectively. A dashed curve 510 illustrates the levels of the supply voltage Vsup 80 if only high-threshold transistors were included in module 20.

During a first functional period 201 (between points of time T0 and T1) the mode signal 88 is low ("0") indicating that the module 20 should operate in a functional mode. It is noted that the change between operational modes of the module 20 can be provided in other manners.

During the first functional period 201 the level of Vsup 80 is set to a functional level (Flevel) 90. Clock signals CLK 80 and CLK_INV 82 alternate. RESET 84 may be asserted ("1") once or more during the first functional period 201 in order to reset one or more flip-flops 22.

The first functional period 201 is followed by a first idle period 202 (between points of time T1 and T2). The transition between the first functional period 201 and the first idle period 202 is triggered by a change in the mode signal 88—from a low level to a high level.

During the first idle period 202 the level of Vsup 80 is set to an idle level (SBlevel) 92. This idle level 92 is lower than the functional level 90 and is also lower than a high-threshold transistor idle level (SBHlevel 91) of a supply voltage that should be supplied to high-threshold transistors of the module 20 in order to guarantee that these high-threshold transistors maintain information when the module 20 is in the idle mode.

During the first idle period 202 both CLK 80 and CLK_INV 82 are maintained constant and RESET 84 is kept low ("0").

The first idle period 202 is followed by a second idle period 203 (between points of time T2 and T3). The transition between the first idle period 202 and the second functional period 203 is triggered by a change in the mode signal 88—from a high level to a low level.

During the second functional period 203 the level of Vsup 80 is set to the functional level (Flevel) 90. Clock signals CLK 80 and CLK_INV 82 alternate. RESET 84 may be asserted ("1") once or more during the first functional period in order to reset one or more flip-flops 22.

The second functional period 203 is followed by a second idle period 204 (between points of time T3 and T4). The transition between the second functional period 203 and the second idle period 204 is triggered by a change in the mode signal 88—from a low level to a high level.

During the second idle period 204 the level of Vsup 80 is set to the idle level (SBlevel) 92.

Figure 6:
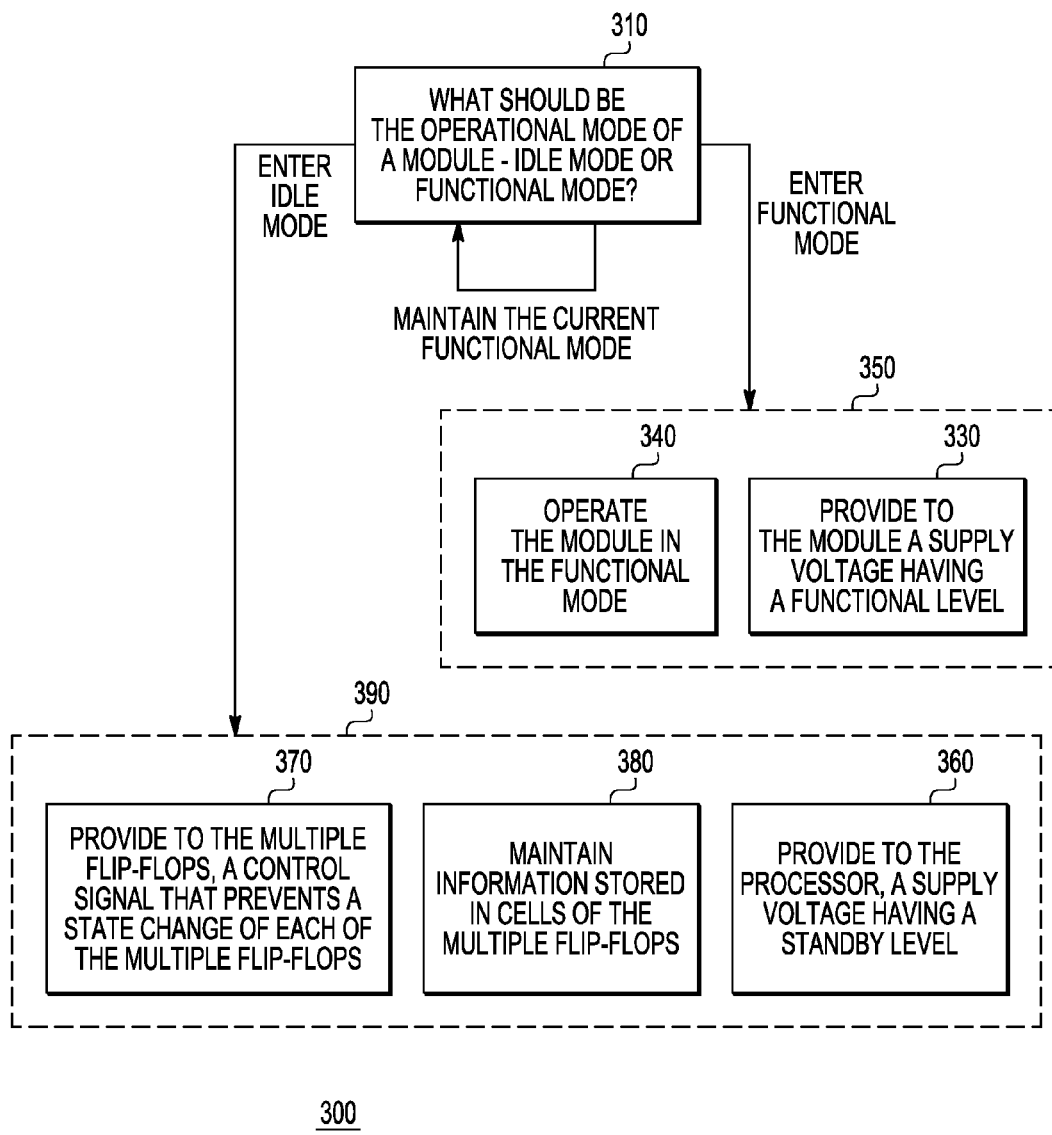
FIG. 6 schematically shows a flow chart of an example of a method for operating a module in an idle mode and in a functional mode.

Referring to FIG. 6, a method for operating a module in a functional mode and in an idle mode is illustrated. The method may, as explained below in further detail, include determining whether the module should enter the functional mode or should enter the idle node. (I) When the module should enter the idle mode the method may include providing to the module a supply voltage of an idle level; maintaining information stored in hybrid circuits of multiple flip-flops of the module; wherein each hybrid circuit comprises a low-threshold transistor that is coupled in parallel to at least one high-threshold transistor; providing to the multiple flip-flops, by a control signal providing circuit that comprises at least one hybrid circuit, a control signal that prevents a state change of each of the multiple flip-flops; wherein high-threshold transistors of each hybrid circuit are arranged to maintain information or a control signal when provided with a supply voltage of a level that is higher than the idle level. (II) When the module should enter the functional mode the method may include providing to the module a supply voltage of a functional level; and operating the module in the functional mode. The operating of the module in the functional mode may include utilizing at least a portion of the information stored in the hybrid circuits of the multiple flip-flops during the idle mode, and providing to the multiple flip-flops a control signal that facilitates a state change of each of the multiple flip-flops.

FIG. 6 schematically shows a flow chart of an example of a method 300 for operating a module in a functional mode and in an idle mode. The module includes multiple flip flips. Each flip includes a majority of high-threshold transistors and a minority of low-threshold transistors. Each high-threshold transistor is arranged to maintain information when provided with a supply voltage of a level that is higher then an idle level. The former voltage is referred to as a high-threshold transistor idle level.

FIG. 6 includes multiple boxes that illustrate various stages. It is noted that these stages can be executed in parallel to each other, in an overlapping or at least partially overlapping manner or in a non-overlapping manner. It is further notes that the order of execution of these stages may deviate from the order of boxes in FIG. 6.

Method 300 starts by (box 310) determining whether to (i) to maintain a module in its current operational mode or to change it and either (ii) enter an idle mode and execute an "idle mode" set of stages 390 (boxes 360, 370 and 380), or (iii) enter a functional mode and execute "functional mode" set of stages 350 (boxes 330 and 340).

The determining (box 310) may be repeated while module 20 operates in its current operational mode.

If determining to maintain the module in the same operational mode then the current operational mode is maintained and the determining may proceed (as illustrated by an arrow that exits box 310 and ends at box 310).

The "functional mode" set of stages 350 includes providing (box 330) to the module, a supply voltage of a functional level. The functional level is higher than the idle level of the supply voltage.

The "functional mode" set of stages 350 also includes operating (box 340) the module in the functional mode.

The operating of the module in the functional mode may include (a) utilizing at least a portion of the information stored in the hybrid circuits of the multiple flip-flops during the idle mode, and (b) providing to the multiple flip-flops a control signal that facilitates a state change of each of the multiple flip-flops. The utilizing may include retrieving at least a portion of the stored information, processing at least a portion of the stored information and the like.

The provision of the control signal may include providing to the multiple flip-flops a control signal that is an alternating clock signal. Additionally or alternatively, the provision of the control signal may include providing to at least one flip flop a reset signal of a value that resets the at least one flip-flop.

The "idle mode" set of stages 390 may include (i) a provision (box 360) to the module a supply voltage having an idle level, (ii) a provision (box 370) to the multiple flip-flops a control signal that prevents a state change of each of the multiple flip-flops; and (iii) maintaining (box 380) of information stored in hybrid circuits of the multiple flip-flops. Each hybrid circuit includes a low-threshold transistor that is coupled in parallel to at least one high-threshold transistor.

The maintaining of information may include maintaining information stored in hybrid circuits that belong to a single latch out of a pair of latches of each flip flop.

The provision to the multiple flip-flops of the control signal that prevents a state change of each of the multiple flip-flops may include at least one out of the following: (i) a provision of the control signal by a control signal providing circuit that includes low-threshold transistors that are arranged to maintain a level of the control signal when the module is in the idle mode; (ii) a provision, to the multiple flip-flops, when the module is in the idle mode, a fixed value clock signal that prevents the state change of each of the multiple flip-flops; and (iii) a provision, to the multiple flip-flops, a reset signal of a value that prevents the multiple flip flops from being reset.

In the foregoing specification, the invention has been described with reference to specific examples of embodiments of the invention. It will, however, be evident that various modifications and changes may be made therein without departing from the broader spirit and scope of the invention as set forth in the appended claims. For example, the power management circuit may belong to the same integrated circuit as the module or may belong to another integrated circuit.

Furthermore, each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

In the claims, the word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An electronic circuit, comprising:
 a module that comprises multiple flip-flops and a control signal providing circuit;
 a power management circuit arranged to provide to the module a supply voltage of a functional level when the module is in a functional mode, and to provide to the module a supply voltage of an idle level when the module is in an idle mode;
 wherein the control signal providing circuit is arranged to provide to the multiple flip-flops, when the module is in the functional mode, a control signal that facilitates a state change of each of the multiple flip-flops;
 wherein the control signal providing circuit is arranged to provide to the multiple flip-flops, when the module is in the idle mode, a control signal that prevents a state change of each of the multiple flip-flops;
 wherein each of the control signal providing circuit and a plurality of flip-flops of the multiple flip-flops comprises at least one hybrid circuit that comprises a low-threshold transistor that is coupled in parallel to at least one high-threshold transistor;
 wherein each hybrid circuit is arranged to maintain information or a control signal when provided with the supply voltage of the idle level;

wherein high-threshold transistors of each hybrid circuit are arranged to maintain information or a control signal when provided with a supply voltage of a level that is higher than the idle level;

wherein each flip-flop of the multiple flip-flops comprises a majority of the high-threshold transistors and a minority of the low-threshold transistors; and wherein each flip-flop of the multiple flip-flops comprises a pair of latches, wherein only one latch of the pair of latches comprises at least one low-threshold transistor.

2. The electronic circuit according to claim 1, wherein the control signal providing circuit is arranged to provide a control signal that is an alternating clock signal to the multiple flip-flops, when the module is in the functional mode; and wherein said control signal providing circuit is arranged to provide to the multiple flip-flops a fixed value clock signal that prevents the state change of each of the multiple flip-flops when the module is in the idle mode.

3. The electronic circuit according to claim 1, wherein the control signal providing circuit is arranged to reset at least one flip-flop of the multiple flip-flops, when the module is in the functional mode; and wherein said control signal providing circuit is arranged to provide to the multiple flip-flops, when the module is in the idle mode, a reset signal of a value that prevents the multiple flip-flops from being reset.

4. The electronic circuit according to claim 1, wherein the control signal providing circuit is arranged to set at least one flip-flop, when the module is in the functional mode; and wherein said control signal providing circuit is arranged to provide to the multiple flip-flops, when the module is in the idle mode, a set signal of a value that prevents the multiple flip-flops from being set.

5. A method for operating a module in a functional mode and in a idle mode, the method comprising:

determining whether the module should enter the functional mode or should enter the idle node;

when the module should enter the idle mode:
providing to the module a supply voltage of an idle level;
maintaining information stored in hybrid circuits of multiple flip-flops of the module; wherein each hybrid circuit comprises a low-threshold transistor that is coupled in parallel to at least one high-threshold transistor;
providing to the multiple flip-flops, by a control signal providing circuit that comprises at least one hybrid circuit, a control signal that prevents a state change of each of the multiple flip-flops;
wherein high-threshold transistors of each hybrid circuit are arranged to maintain information or a control signal when provided with a supply voltage of a level that is higher than the idle level;

when the module should enter the functional mode:
providing to the module a supply voltage of a functional level;
operating the module in the functional mode, wherein the operating of the module in the functional mode comprises:
utilizing at least a portion of the information stored in the hybrid circuits of the multiple flip-flops during the idle mode, and
providing to the multiple flip-flops a control signal that facilitates a state change of each of the multiple flip-flops; and wherein each flip-flop of the multiple flip-flops comprise a pair of latches, wherein only one latch of the pair of latches comprises at least one low-threshold transistor.

6. The method according to claim 5, comprising maintaining information stored in hybrid circuits that belong to a single latch out of a pair of latches of each flip-flop.

7. The method according to claim 5, comprising providing to the multiple flip-flops the control signal that prevents a state change of each of the multiple flip-flops by a control signal providing circuit that comprises hybrid circuits that comprise low-threshold transistors and high-threshold transistors and are arranged to maintain a level of the control signal when the module is in the idle mode.

8. The method according to claim 5, comprising:
providing to the multiple flip-flops, when the module is in the functional mode, a control signal that is an alternating clock signal; and
providing to the multiple flip-flops, when the module is in the idle mode, a fixed value clock signal that prevents the state change of each of the multiple flip-flops.

9. The method according to claim 5, comprising:
providing to at least one flip-flop, when the module is in the functional mode, a control signal that is a reset signal of a value that resets the at least one flip-flop; and
providing to the multiple flip-flops, when the module is in the idle mode, a reset signal of a value that prevents the multiple flip-flops from being reset.

10. The method according to claim 5, wherein each flip-flop of the multiple flip-flops comprises a majority of the high-threshold transistors and a minority of the low-threshold transistors.

11. An electronic circuit, comprising:
a module that comprises multiple flip-flops and a control signal providing circuit;
a power management circuit arranged to provide to the module a supply voltage of a functional level when the module is in a functional mode, and to provide to the module a supply voltage of an idle level when the module is in an idle mode;
wherein the control signal providing circuit is arranged to provide to the multiple flip-flops, when the module is in the functional mode, a control signal that facilitates a state change of each of the multiple flip-flops;
wherein the control signal providing circuit is arranged to provide to the multiple flip-flops, when the module is in the idle mode, a control signal that prevents a state change of each of the multiple flip-flops;
wherein each of the control signal providing circuit and a plurality of flip-flops of the multiple flip-flops comprises at least one hybrid circuit that comprises a low-threshold transistor that is coupled in parallel to at least one high-threshold transistor;
wherein each hybrid circuit is arranged to maintain information or a control signal when provided with the supply voltage of the idle level;
wherein high-threshold transistors of each hybrid circuit are arranged to maintain information or a control signal when provided with a supply voltage of a level that is higher than the idle level;
wherein each flip-flop of the multiple flip-flops comprises a pair of latches; and
wherein only one latch of the pair of latches comprises at least one low-threshold transistor.

12. The electronic circuit according to claim 11, wherein the control signal providing circuit is arranged to reset at least one flip-flop of the multiple flip-flops, when the module is in the functional mode.

13. The electronic circuit according to claim 11, wherein the control signal providing circuit is arranged to provide a control signal that is an alternating clock signal to the multiple flip-flops, when the module is in the functional mode; and wherein said control signal providing circuit is arranged to provide to the multiple flip-flops a fixed value clock signal that prevents the state change of each of the multiple flip-flops when the module is in the idle mode.

14. The electronic circuit according to claim 11, wherein the control signal providing circuit is arranged to reset at least one flip-flop of the multiple flip-flops, when the module is in the functional mode; and wherein said control signal providing circuit is arranged to provide to the multiple flip-flops, when the module is in the idle mode, a reset signal of a value that prevents the multiple flip-flops from being reset.

15. The electronic circuit according to claim 11, wherein the control signal providing circuit is arranged to set at least one flip-flop, when the module is in the functional mode; and wherein said control signal providing circuit is arranged to provide to the multiple flip-flops, when the module is in the idle mode, a set signal of a value that prevents the multiple flip-flops from being set.

16. The electronic circuit according to claim 11, wherein each flip-flop of the multiple flip-flops comprises a pair of latches, wherein each flip-flop is arranged to maintain information stored in hybrid circuits that belong to a single latch out of a pair of latches of each flip-flop.

17. The electronic circuit according to claim 1, wherein each flip-flop of the multiple flip-flops comprises a pair of latches, wherein each flip-flop is arranged to maintain information stored in hybrid circuits that belong to a single latch out of a pair of latches of each flip-flop.

* * * * *